(12) United States Patent
Koester

(10) Patent No.: US 8,343,838 B2
(45) Date of Patent: Jan. 1, 2013

(54) METHOD OF REDUCING DISLOCATION-INDUCED LEAKAGE IN A STRAINED-LAYER FIELD-EFFECT TRANSISTOR BY IMPLANTING BLOCKING IMPURITY INTO THE STRAINED-LAYER

(75) Inventor: Steven J. Koester, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/539,235

(22) Filed: Aug. 11, 2009

(65) Prior Publication Data

US 2009/0325358 A1 Dec. 31, 2009

Related U.S. Application Data

(62) Division of application No. 10/717,279, filed on Nov. 19, 2003, now abandoned.

(51) Int. Cl.
*H01L 21/8258* (2006.01)

(52) U.S. Cl. ........ 438/276; 438/285; 438/289; 438/522; 438/590; 257/E21.603

(58) Field of Classification Search .................. 438/199, 438/285, 289, 520, 528, 590, 276, 522
See application file for complete search history.

(56) References Cited

U.S. PATENT DOCUMENTS

| | | | |
|---|---|---|---|
| 5,134,447 A | 7/1992 | Ng et al. | |
| 5,245,208 A | 9/1993 | Eimori | |
| 5,969,407 A | 10/1999 | Gardner et al. | |
| 6,432,802 B1 | 8/2002 | Noda et al. | |
| 6,555,839 B2 | 4/2003 | Fitzgerald | |
| 6,756,276 B1 * | 6/2004 | Xiang et al. | 438/289 |
| 6,844,227 B2 | 1/2005 | Kubo et al. | |
| 6,849,527 B1 | 2/2005 | Xiang | |
| 6,936,505 B2 | 8/2005 | Keys et al. | |
| 2002/0033511 A1 | 3/2002 | Babcock et al. | |
| 2004/0072394 A1 * | 4/2004 | Noda | 438/163 |
| 2004/0075105 A1 | 4/2004 | Leitz et al. | |
| 2005/0104092 A1 | 5/2005 | Koester | |

FOREIGN PATENT DOCUMENTS

JP 11087706 3/1999

OTHER PUBLICATIONS

G.G. Shahidi et al., "A High Performance 0.15 Micro-Meter CMOS" VLSI, Tech Symp. Dig. 1993, pp. 93-94.
K. Shibahara et al., "Low Resistive Ultra Shallow Junctions for Sub 0.1 micro-meter MOSFETs", IEDM 1996, pp. 579-582.

* cited by examiner

*Primary Examiner* — Anh Mai
(74) *Attorney, Agent, or Firm* — Scully, Scott, Murphy & Presser, P.C.; Louis J. Percello, Esq.

(57) ABSTRACT

A structure and method of fabricating a semiconductor field-effect transistor (MOSFET) such as a strained Si n-MOSFET where dislocation or crystal defects spanning from source to drain is partially occupied by heavy p-type dopants. Preferably, the strained-layer n-MOSFET includes a Si, SiGe or SiGeC multi-layer structure having, in the region between source and drain, impurity atoms that preferentially occupy the dislocation sites so as to prevent shorting of source and drain via dopant diffusion along the dislocation. Advantageously, devices formed as a result of the invention are immune to dislocation-related failures, and therefore are more robust to processing and material variations. The invention thus relaxes the requirement for reducing the threading dislocation density in SiGe buffers, since the devices will be operable despite the presence of a finite number of dislocations.

3 Claims, 10 Drawing Sheets

METHOD OF REDUCING DISLOCATION-INDUCED LEAKAGE IN A STRAINED-LAYER FIELD-EFFECT TRANSISTOR BY IMPLANTING BLOCKING IMPURITY INTO THE STRAINED-LAYER

CROSS REFERENCE TO RELATED APPLICATIONS

This application is a divisional application of U.S. Ser. No. 10/717,279 filed on Nov. 19, 2003 entitled "METHOD OF REDUCING DISLOCATION-INDUCED LEAKAGE IN A STRAINED-LAYER FIELD-EFFECT TRANSISTOR. The entire content of the aforementioned U.S. application is incorporated herein by reference.

BACKGROUND OF THE INVENTION

1. Field of the Invention

The present invention relates to semiconductors and transistors and more particularly to Si/SiGe strained-layer field-effect transistors.

2. Description of the Prior Art

Semiconductor Si/SiGe strained-layer MOSFETs fabricated using strained Si have potential for improved performance due to higher carrier mobility in the strained Si layer. The strain in the Si is typically achieved by first forming a relaxed SiGe layer, and then epitaxially growing the Si layer on top. Since the SiGe has a larger lattice constant than Si, the Si will be under tensile strain. The underlying relaxed SiGe layer can be formed in numerous ways, but is typically formed by growing a graded-Ge-content SiGe layer on a Si substrate, followed by a thick constant-composition SiGe layer. The SiGe relaxes by misfit dislocation formation near the original growth interface, with a fairly high density (on the order of about $10^6$ cm$^{-2}$-$10^8$ cm$^{-2}$) of threading dislocations that extend to the sample surface. These threading dislocations continue to extend to the sample surface after growth of the strained Si cap layer. During high-temperature processing, additional misfit dislocations can form if the threading dislocations glide along the interface of the relaxed SiGe layer and the strained Si layer. The threading and misfit dislocations can lead to device failure in a short-channel MOSFET fabricated on these layers particularly if the dislocation extends continuously from the source implant region to the drain implant region. In this case, the dopants from the source and drain can segregate along the dislocation, causing a direct "pipe" from source to drain, resulting in device leakage. This is especially true for n-MOSFETs since the n-type dopant atoms in the source and drain (usually P and As) are larger than the p-type dopant atoms in the well region (usually B). Since larger atoms can preferentially occupy dislocation sites, n-MOSFETs are more likely to suffer from dislocation-related failures of the type described above.

FIGS. 1(a) and 1(b) depict schematic diagrams of the dislocation-induced leakage mechanism. Specifically, FIG. 1(a) illustrates a strained Si-on-relaxed-SiGe n-MOSFET device 10 formed between two dielectric isolation regions 12a, 12b. Manufactured by techniques known in the art, the n-MOSFET includes a relaxed SiGe substrate layer 15 doped p-type and including a strained Si channel layer 18 formed on top of the relaxed SiGe layer to form a Si/SiGe interface 22 between respective n-type drain and source regions 20a, 20b. On top of the grown strained Si layer is formed a gate dielectric layer 28 (e.g., an oxide such as SiO$_2$) and a gate 30 formed thereon. As shown in FIG. 1, the n-MOSFET may form a threading dislocation 25 protruding up from the substrate 15 that glides along the Si/SiGe interface 22 and then terminates at the surface. As mentioned, the SiGe relaxes by misfit dislocation formation near the original growth interface 22, with a fairly high density of threading dislocations that extend to the sample surface. These threading dislocations continue to extend to the sample surface after growth of the strained Si cap layer. During high-temperature processing, additional misfit dislocations can form if the threading dislocations glide along the interface 22 of the relaxed SiGe layer 25 and the strained Si layer 18.

After an annealing process, the n-type dopants from the source and drain 20a, 20b may segregate along the dislocation, and if the gate length is sufficiently short, join together to form a leakage path 40 between source and drain, as shown in FIG. 1(b). FIG. 2 illustrates a plot 50 of the drain current, $I_d$, versus the gate voltage, $V_g$, for a strained Si n-MOSFET with dislocation-induced leakage. The data shows that the leakage is seen to occur directly from source to drain (and not from source to body or drain to body, $I_b$), resulting in poor turn off behavior and high leakage 55 in the subthreshold region ($V_{gs}$<0).

To date the main methods of trying to overcome the problem of dislocation-induced leakage have been to reduce the density of initial dislocations in the relaxed SiGe material, and to ensure that the strained Si layer thickness is less than the critical thickness for thermodynamic stability. Both of these methods have been successful in reducing dislocation-induced leakage, but it is very difficult to completely eliminate the threading dislocations and process-induced misfit dislocations. As the Ge content is increased, the defect-related problems are exacerbated, since relaxed SiGe layers with higher Ge content tend to have higher densities of threading dislocations, and require thinner Si caps to prevent misfit formation. So even though improving the substrate material may reduce the number of dislocation-induced failures, these improvements may not be sufficient for applications requiring very high levels of integration, where even a very small number of devices with dislocation-induced leakage may be intolerable.

The interaction of dopant atoms with dislocations has been widely studied. It has been previously shown that heavy dopant atoms, such as In, can segregate to end-of-range dislocations in Si such as described in Noda et al., *J. Appl. Phys.* 88, 4980 (2000). The effect of implanting heavy neutral impurities such Sn into Si has been studied in C. Claeys et al., *J. Electrochem. Soc.* 148, G738 (2001), for example, and it was found that Sn acts as a vacancy getter. These results therefore suggest that Sn may also acts as a getter for dislocations. Kaplan et al. in the reference Kaplan et al., *Phys. Rev. B* 58, 12865 (1998) also noted that Ga impurities segregated to dislocations in Si could form quantum wire conducting paths. However, neither a structure nor a method by which dopant and/or neutral impurity atoms could be used to intentionally occupy the region in the vicinity of dislocations for the purpose of preventing dislocation-induced leakage in strained-layer MOSFETs have been proposed.

It would thus be highly desirable to provide a method and structure for reducing the leakage in strained-layer MOSFETs without the need for eliminating the defects themselves.

SUMMARY

It is an object of the present invention to provide a method and structure for reducing the leakage in strained-layer MOSFETs without the need for eliminating the defects themselves.

The present invention involves the introduction of dopant species that preferentially occupy the dislocation site or the region in the vicinity of the dislocation, thus preventing leakage caused by dopants that diffuse along a dislocation bridging the source and drain.

According to a first aspect of the invention, there is provided a semiconductor field-effect transistor device comprising: a first layer of semiconductor material doped of a first dopant type; a source region and a drain region implanted with dopants of a second opposite type; a gate electrode separated from the first layer by a dielectric region, and positioned between said source and drain electrodes; the substrate having one or more dislocation or crystal defects that extend continuously from the source region to the drain region, and blocking impurity dopant materials implanted to partially or fully occupy the dislocation defects, wherein the blocking impurity dopant materials substantially inhibit diffusion of the implanted source and drain dopants from diffusing along the dislocation or crystal defect.

According to a second aspect of the invention, there is provided a method for forming a semiconductor field-effect transistor device comprising the steps of: a) forming a first semiconductor structure comprising material with a non-zero number of threading dislocations and doped with a first dopant type; b) implanting a blocking impurity in the semiconductor structure; c) thermally processing the semiconductor structure such that the blocking impurities segregate to the existing threading dislocations, the blocking impurities further segregating to new dislocations that may be induced by the thermal processing; d) forming a dielectric layer on top of the semiconductor structure to define a gate region, and forming a gate electrode over the dielectric region, a portion of the semiconductor structure immediately beneath the gate defining a channel region, and a portion of the semiconductor structure beneath the channel region defining a well region; and, e) implanting dopants in the semiconductor structure on opposite sides of said gate region to form source and drain regions such that the source and drain regions abut the channel region and well region on either side, wherein a dislocation or crystal defect extends continuously from the source to drain region, and an immediate vicinity of said crystal defect is substantially occupied by the blocking impurity dopant.

Advantageously, the device and fabricating method of the invention relaxes the requirement for reducing the threading dislocation density in SiGe buffers, since the devices will be operable despite the presence of a finite number of dislocations.

DESCRIPTION OF THE SEVERAL VIEWS OF THE DRAWINGS

Further features, aspects and advantages of the apparatus and methods of the present invention will become better understood with regard to the following description, appended claims, and accompanying drawings where:

DETAILED DESCRIPTION

Figure 1A:
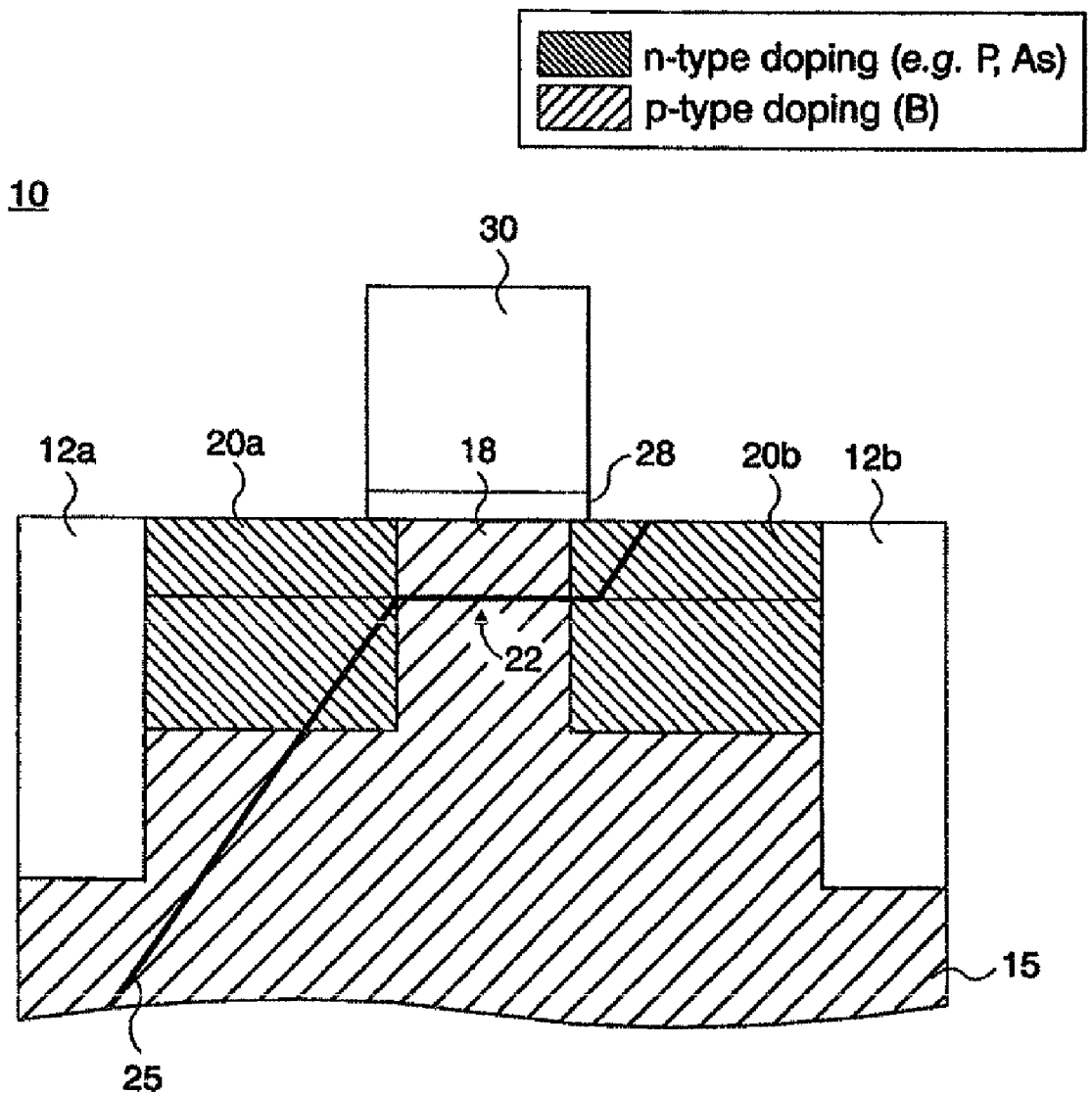
FIG. 1(a) is a schematic cross-sectional diagram of a strained-Si-on-relaxed-SiGe n-MOSFET.
Figure 1B:
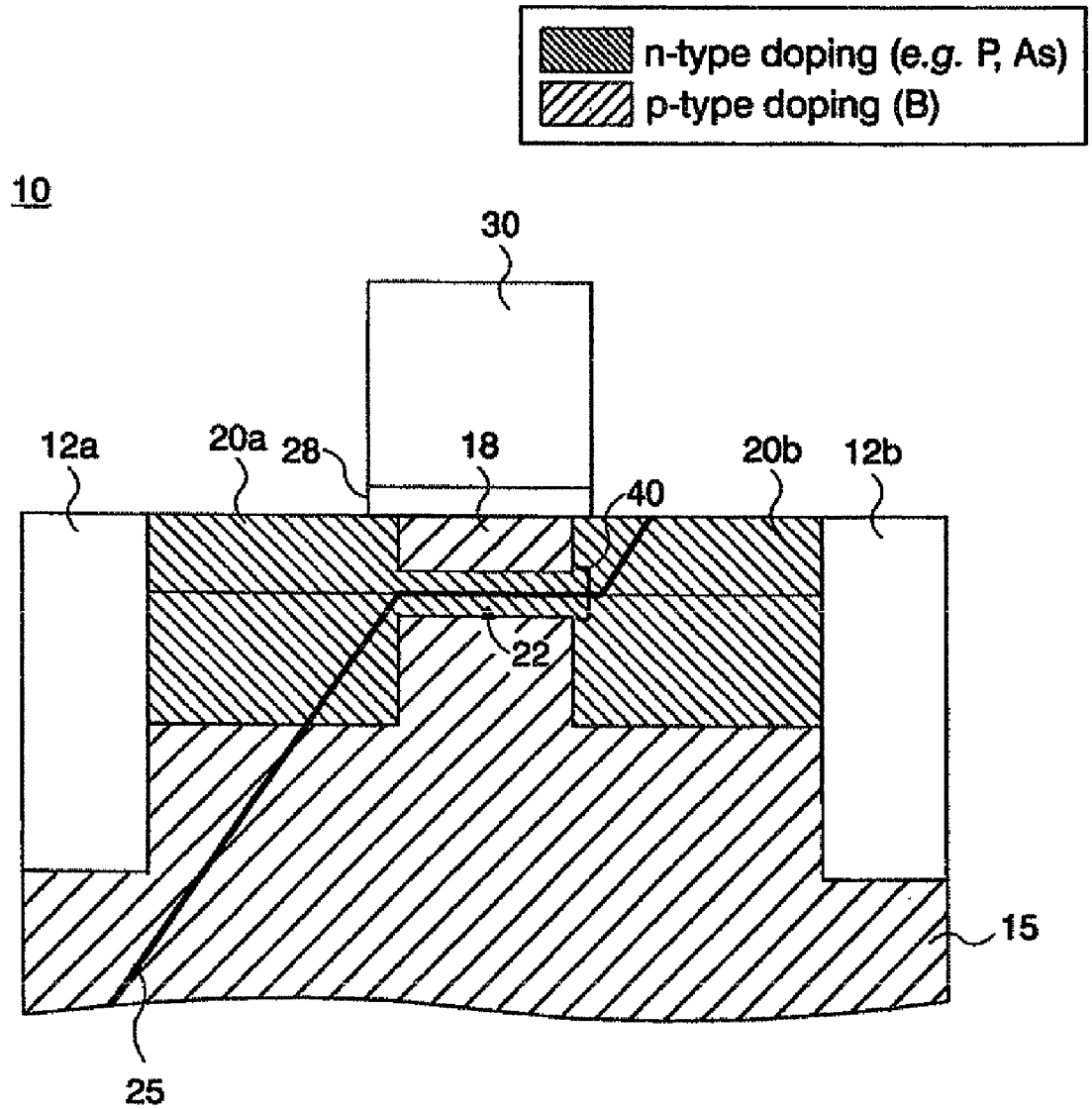
FIG. 1(b) is a schematic cross-sectional diagram of a strained-Si-on-relaxed-SiGe n-MOSFET with threading and misfit dislocations where source and drain dopants have segregated along the dislocation to form a leakage path between source and drain.
Figure 2:
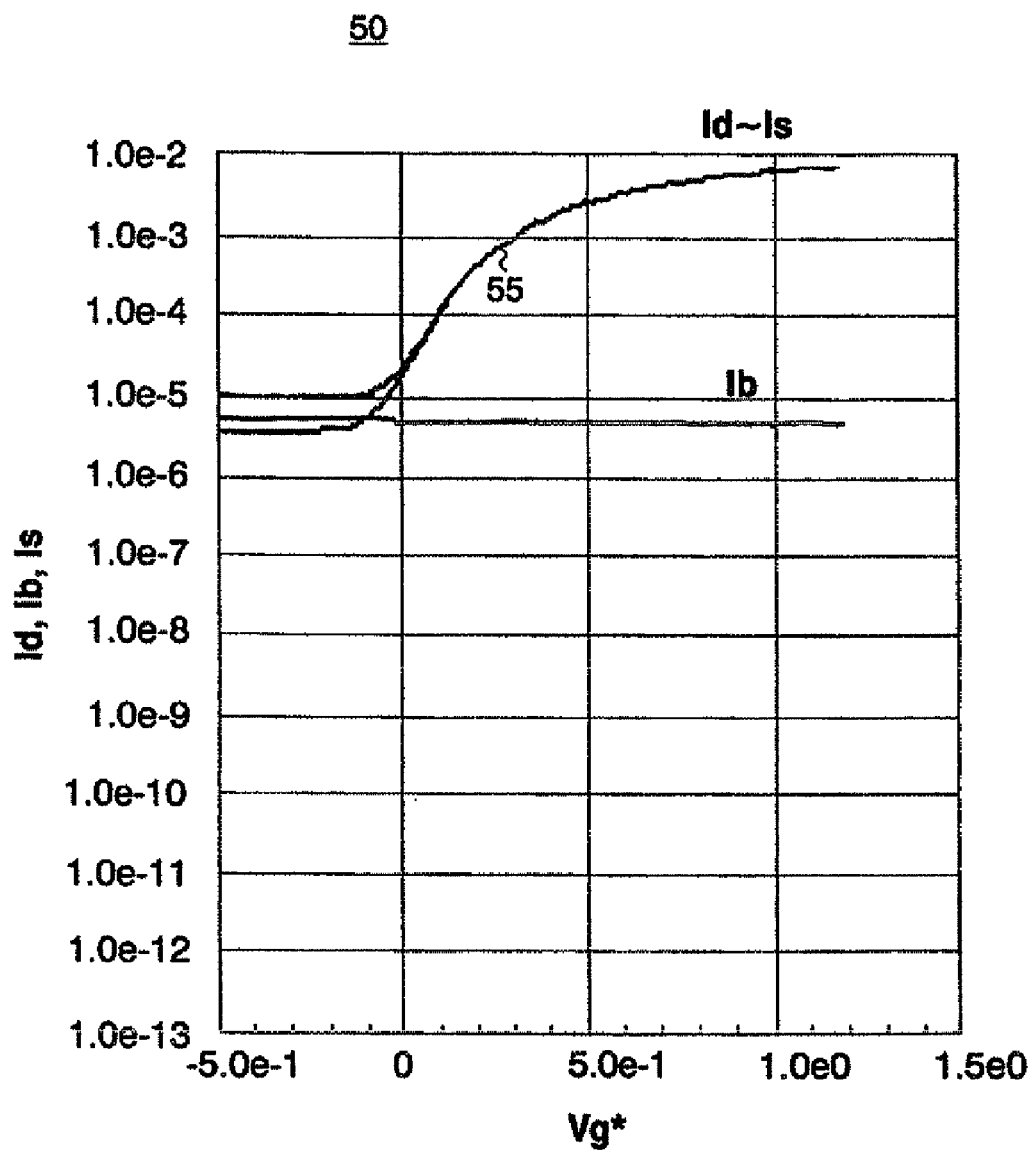
FIG. 2 is a plot of experimental data illustrating dislocation-induced leakage in a short-channel strained-Si-on-relaxed-SiGe n-MOSFET.
Figure 3:
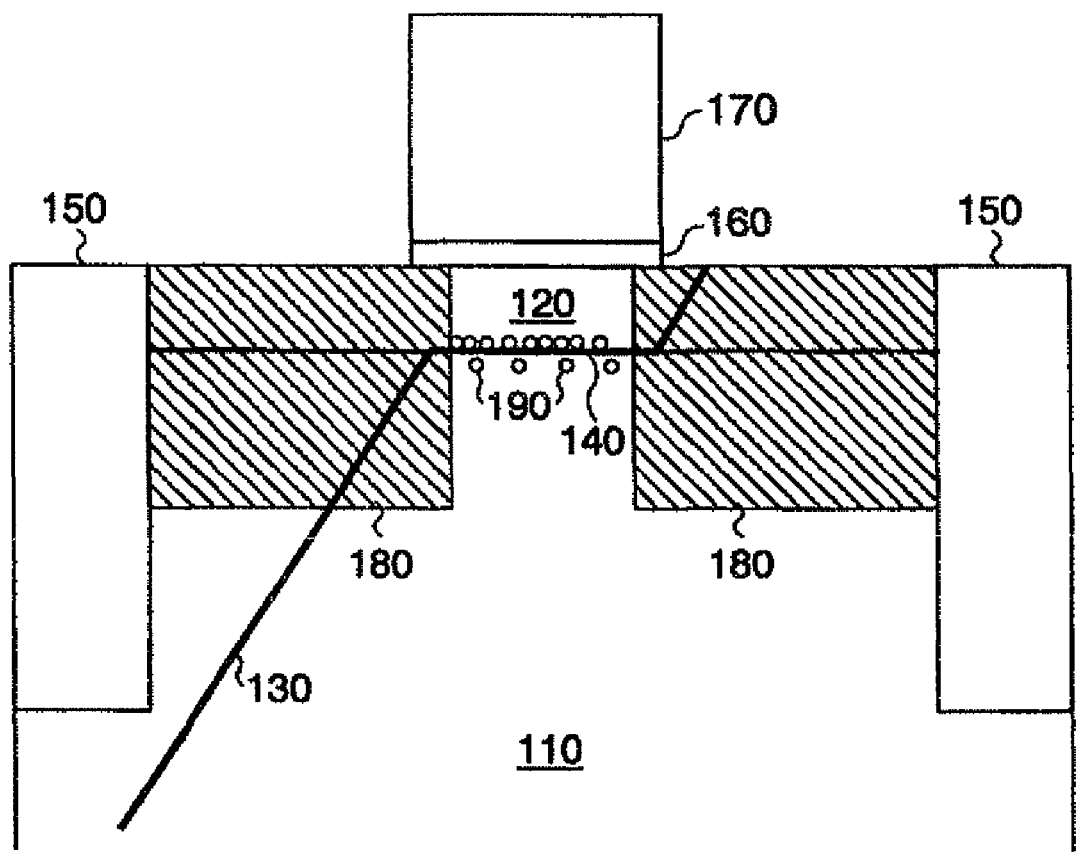
FIG. 3 is a cross-sectional diagram of a first embodiment of the invention showing a strained Si n-MOSFET where a defect spanning from source to drain is partially occupied by heavy p-type dopants.

FIG. 3 is a cross-sectional diagram of a first embodiment of the invention showing a strained Si n-MOSFET where a defect spanning from source to drain is partially occupied by heavy p-type dopants. Preferably, the strained-layer n-MOSFET includes a Si, SiGe or SiGeC multi-layer structure consisting of these materials, that has, in the region between source and drain, impurity atoms that preferentially occupy the dislocation sites so as to prevent shorting of source and drain via dopant diffusion along the dislocation. Advantageously, devices formed as a result of the invention are immune to dislocation-related failures, and therefore are more robust to processing and material variations. This invention relaxes the requirement for reducing the threading dislocation density in SiGe buffers, since the devices will be operable despite the presence of a finite number of dislocations.

In the preferred embodiment of the strained Si n-MOSFET depicted in FIG. 3, indium, In, is utilized as a blocking material to prevent diffusion of arsenic, As, or phosphorous, P, or both species along a dislocation that spans from source to drain. The strained Si n-MOSFET layer structure includes a SiGe relaxed substrate 110, and a strained Si capping layer 120. The SiGe relaxed substrate 110 has a finite density of threading dislocations 130 that protrude to the wafer surface. The layer structure may also have a finite number of misfit dislocations 140 that extend along the Si/SiGe interface 22, the ends of which are terminated by a threading dislocation. The device has trench isolation regions 150, an insulating gate dielectric 160 formed of dielectric material such as: an oxide, nitride, oxynitride of silicon, and oxides and silicates of Hf, Al, Zr, La, Y, Ta, singly or in combinations, and a gate electrode 170 a portion of which may comprise polysilicon, polysilicongermanium, or the metals: Mo, Pt, Ir, W, Pd, Al, Au, Ni, Cu, Ti, and Co, their silicides and germanosilicides, either singly or in combinations. In the preferred embodiment, the source and drain electrodes 180 are doped n-type with P or As or, a combination of the two dopants. The regions of the relaxed SiGe substrate 100 between and below the source and drain regions are doped p-type. The region of the dislocation between the source and drain is partially occupied by In atoms 190 that act to block segregation of the source and drain dopant atoms along the dislocation, thus preventing a short between source and drain.

Figure 4:
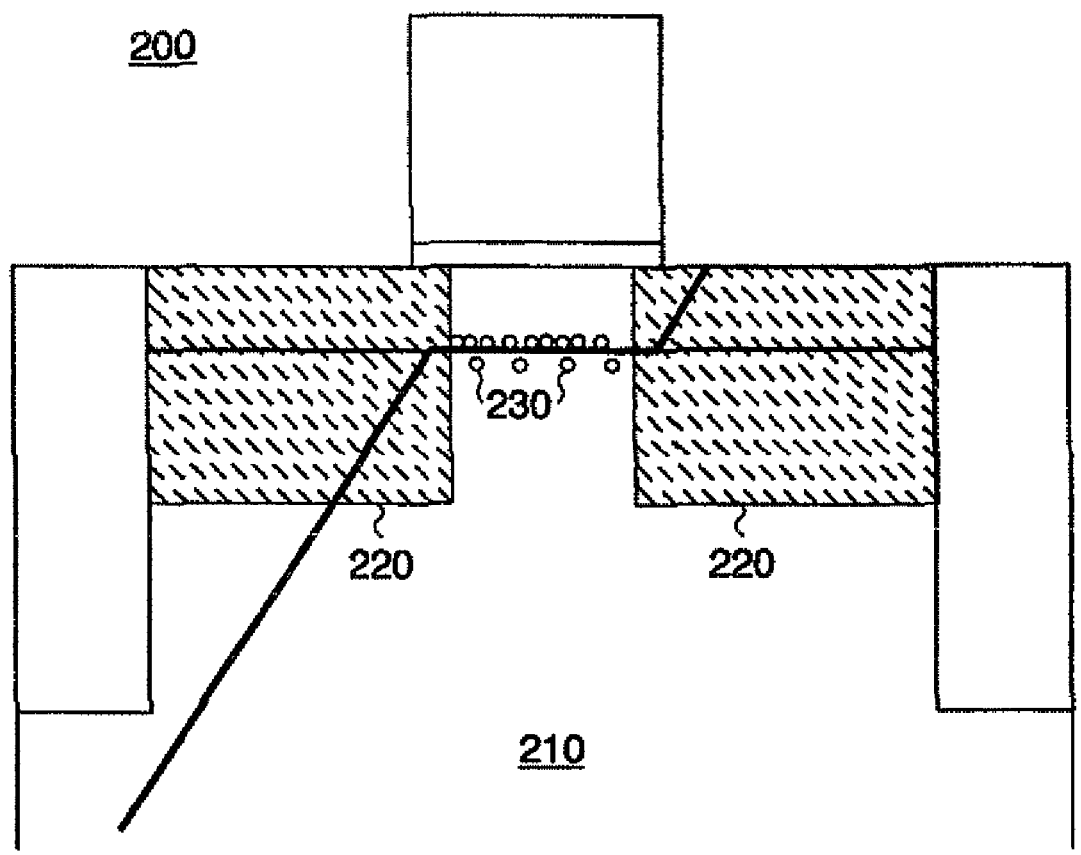
FIG. 4 is a cross-sectional diagram of a second embodiment of the invention showing a strained Si p-MOSFET where a defect spanning from source to drain is partially occupied by heavy n-type dopants.

FIG. 4 is a cross-sectional diagram of a second embodiment of the invention showing a strained Si p-MOSFET device 200 where a defect spanning from source to drain is partially occupied by heavy n-type dopants. This device has the same structure as in FIG. 3, except that the source and drain electrodes 220 are p-type doped with boron, B, for example, the regions 210 between and below the source and drain regions are doped n-type. In the embodiment of the strained Si p-MOSFET depicted in FIG. 4, antimony, Sb, is utilized as a blocking material for boron, B, diffusion along the dislocation. That is, the region of the dislocation between the source and drain regions is partially occupied by Sb atoms 230 that act to block segregation of the source and drain dopant atoms along the dislocation, thus preventing a short between source and drain.

Figure 5:
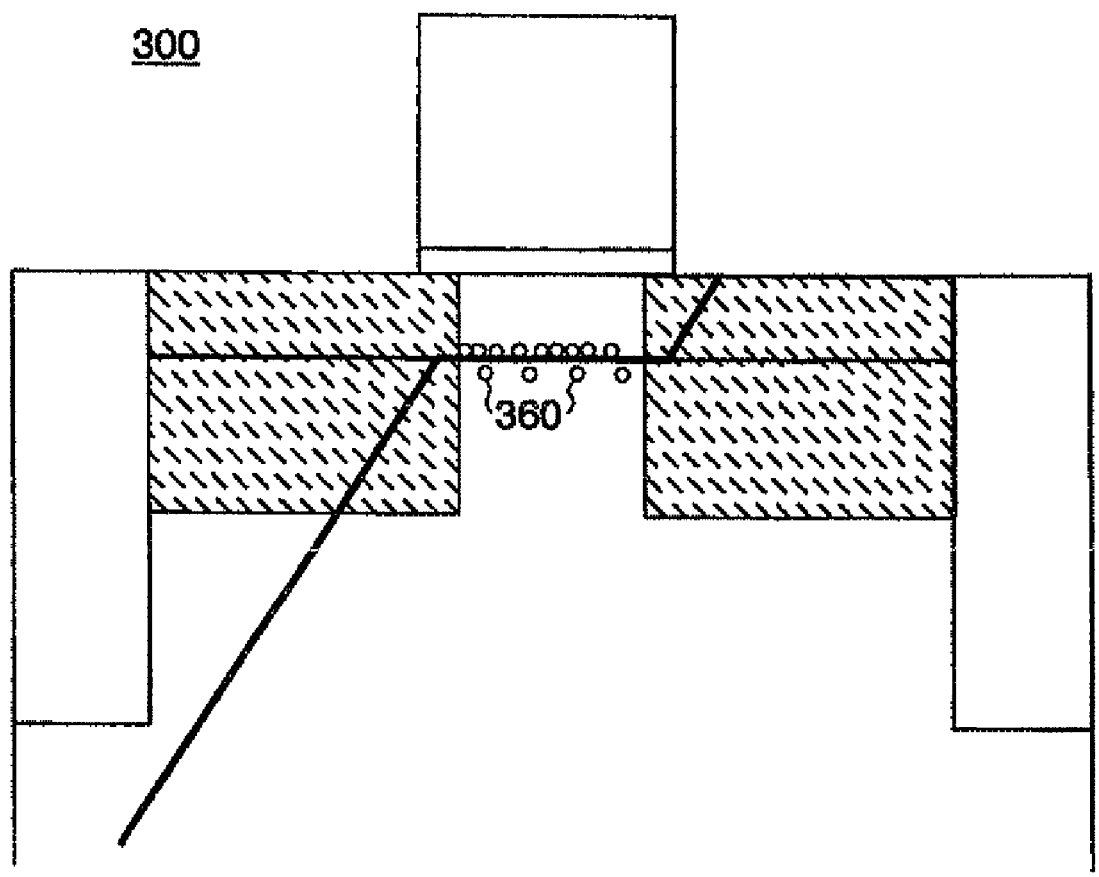
FIG. 5 is a cross-sectional diagram of a third embodiment of the invention showing a strained Si MOSFET where a defect spanning from source to drain is partially occupied by neutral impurities; and, FIGS. 6(a)-6(h) depict a process sequence for improving the dislocation-related leakage in strained-layer MOSFETs.

FIG. 5 is a cross-sectional diagram of a third embodiment of the invention showing a strained Si p-MOSFET device 300 having the same structure as either the device in FIG. 3 or FIG. 4. In the third embodiment, dislocation defect sites spanning from source to drain are partially occupied by neutral dopant species 360 that blocks segregation of the source and drain dopant atoms along the dislocation, thus preventing a short between source and drain implant regions. The advantage of neutral impurities is that they are less likely to affect the electrical properties of the device, and so higher doses could be used to more effectively passivate the device. In addition, the same dopant species may be used to passivate both nFETs and pFETs. The preferred candidates for neutral impurity passivation species are group IV impurities such as carbon, (C), tin (Sn) or lead (Pb), or a combination thereof. The implanted species may also form a complex with existing impurities in the semiconductor such as C or oxygen (O).

Figure 6A:
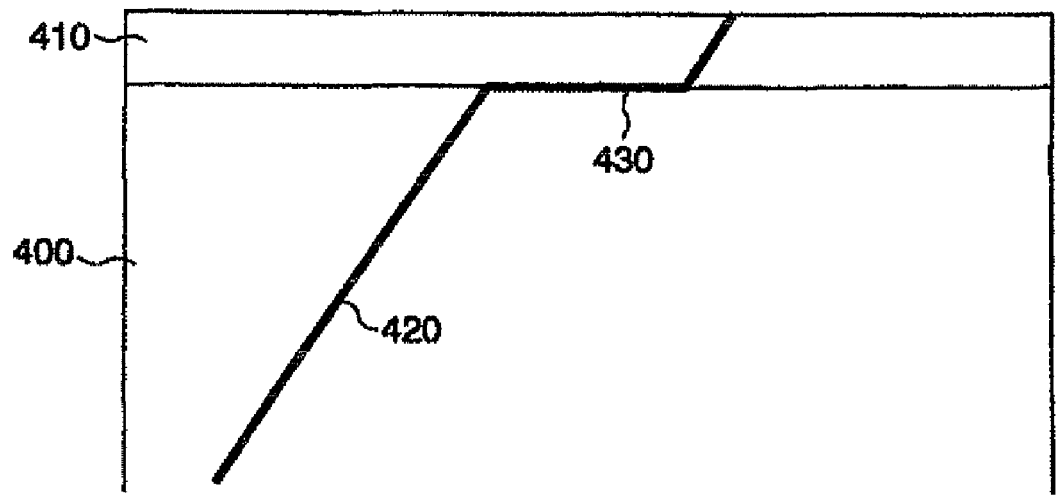
Figure 6B:
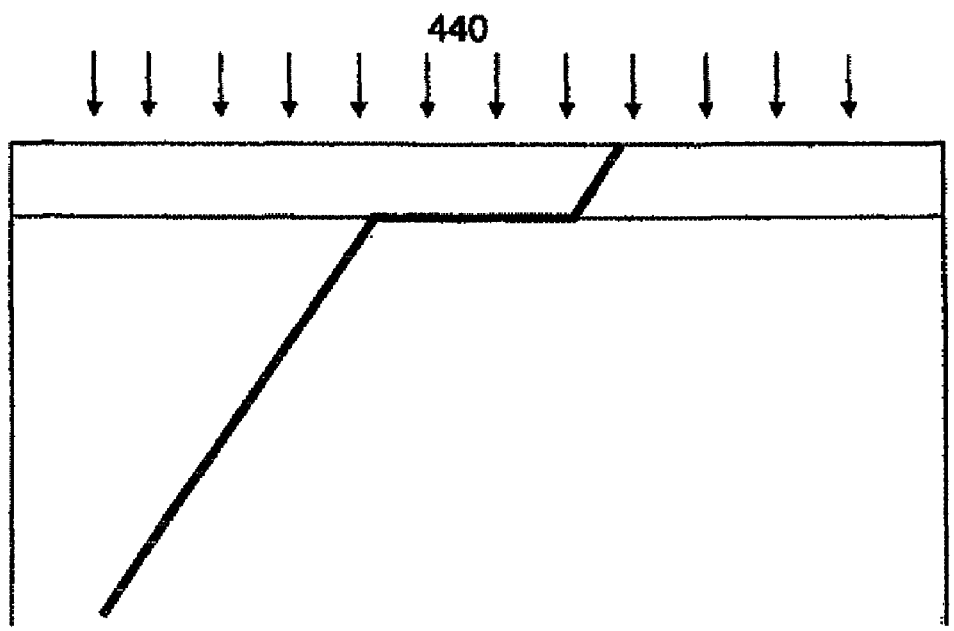
Figure 6C:
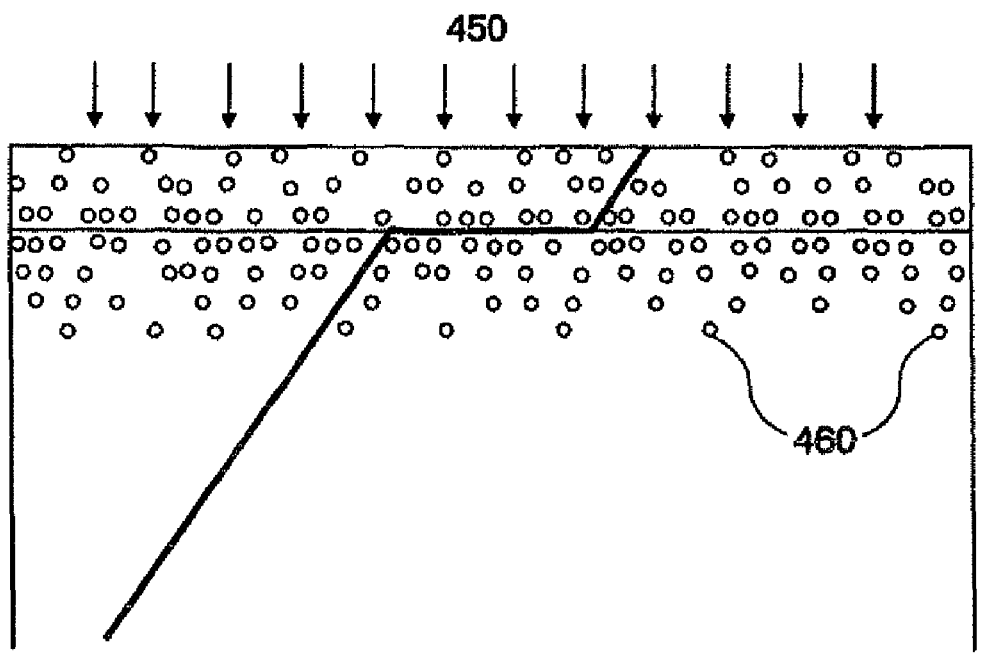
Figure 6D:
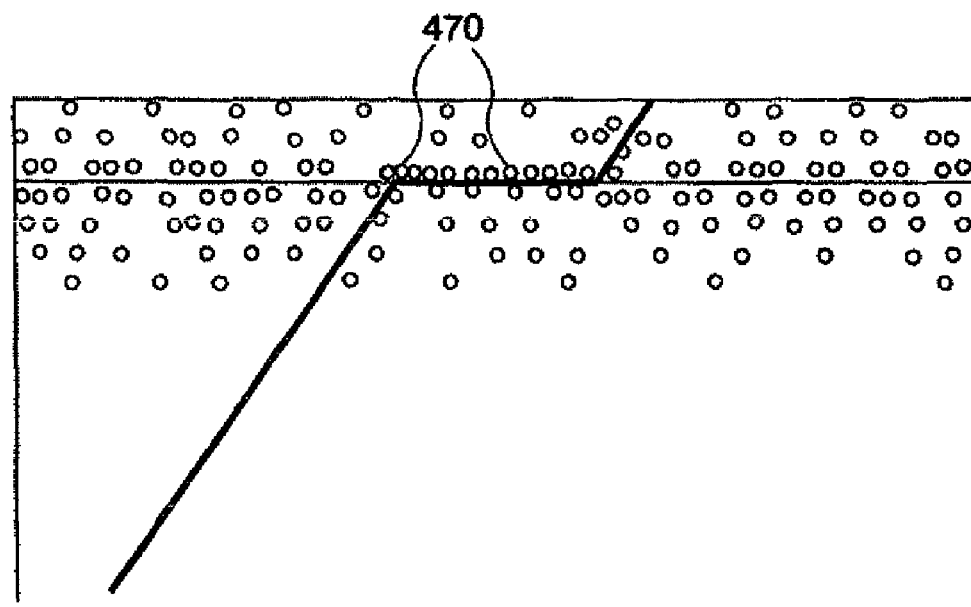
Figure 6E:
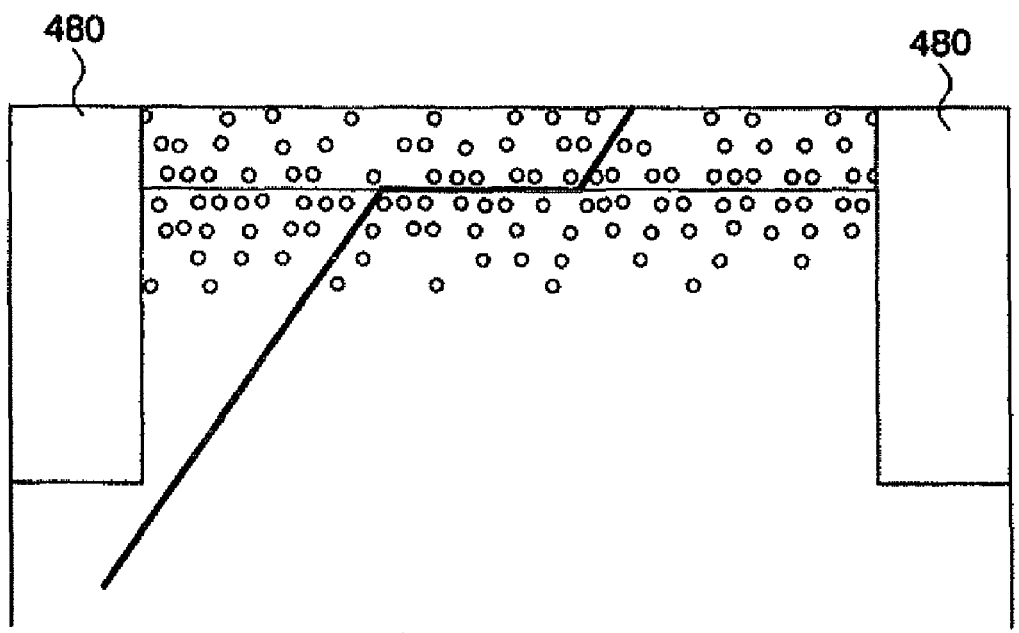
Figure 6F:
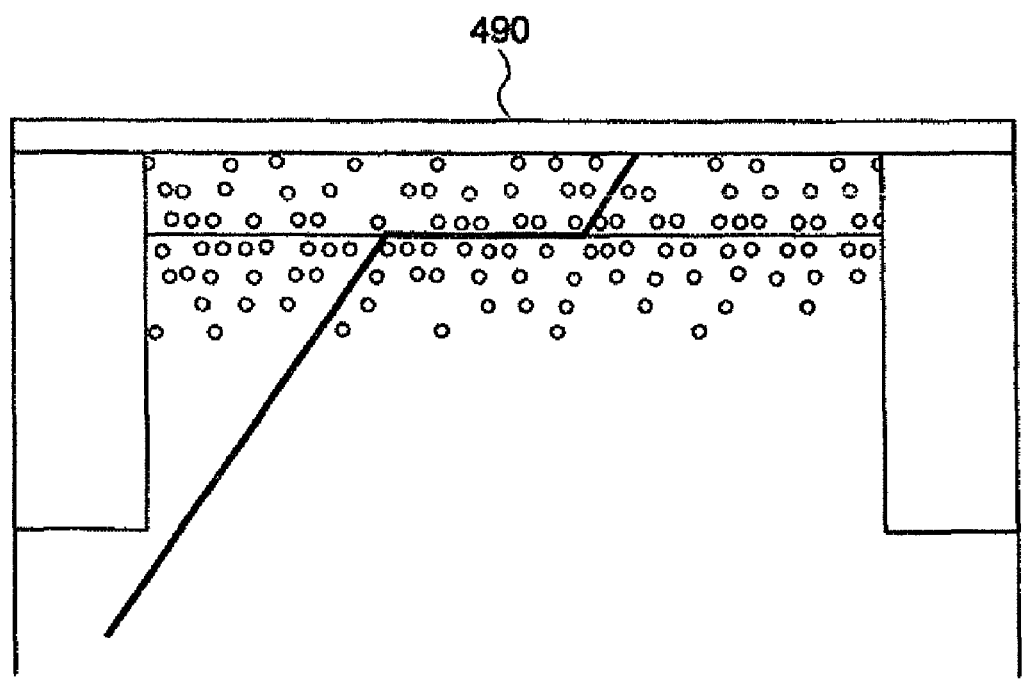
Figure 6G:
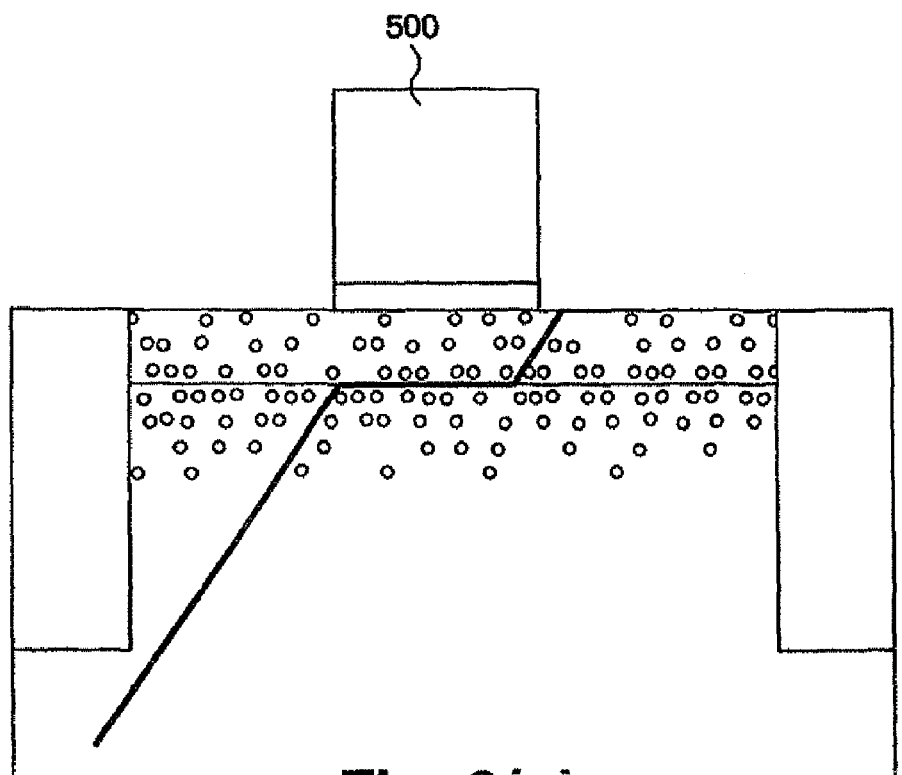
Figure 6H:
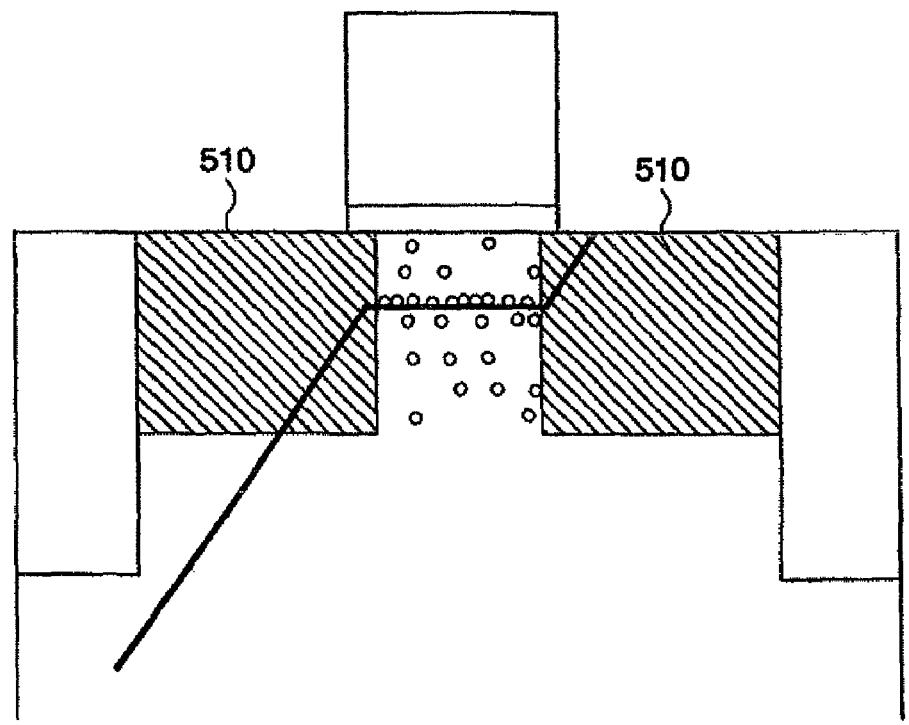

The present invention also provides a method for improving the dislocation-related leakage in strained-layer MOSFETs. The process flow for one such method is illustrated in FIGS. 6(a)-6(h). In the preferred embodiment, the starting substrate comprises a relaxed SiGe 400 and a strained Si surface layer 410 as shown in FIG. 6(a). The substrate has a finite number of threading dislocations 420 and may also have a finite number of misfit dislocations 430 at the Si/SiGe interface 22. As shown in FIG. 6(b), well doping 440 is introduced by ion implantation. For an n-MOSFET, this dopant is p-type species, and for a p-MOSFET, the dopant is n-type. Next, as shown in FIG. 6(c), the blocking impurity is introduced by ion implantation 450, such that the peak concentration corresponds roughly to the Si/SiGe interface where additional misfit dislocations are likely to form. Preferably, a blocking impurity is implanted with an energy such that the peak blocking impurity concentration approximately coincides with a Si/SiGe interface. For instance, in an example embodiment, for a 20 nm strained Si layer on SiGe, the preferred implant energies would be 20-30 keV for In, Sn or Sb blocking impurities. The concentration of blocking atoms required to effectively passivate the dislocations depends on the process details, and specifically on the subsequent thermal processing. Preferably the concentration of blocking atoms ranges between $10^{17}$ cm$^{-3}$-$10^{19}$ cm$^{-3}$ with the exact amount determined by the diffusivity of the species and the expected number of atoms need to effectively passivate the dislocation. After an annealing step, the blocking species preferentially occupies the dislocation site 470 as shown in FIG. 6(d). Next, as shown in FIGS. 6(e) through 6(g), isolation regions 480, gate oxide 490, and gate electrode 500 patterning are performed. Finally, as shown in FIG. 6(h), source/drain dopants 510 are implanted and activated by annealing. Since the blocking dopants are implanted before the source and drain dopants, and therefore already occupy the region in the vicinity of the dislocation, the source and drain dopants would need to displace the blocking species in order to segregate along the dislocation, thereby reducing the probably of dislocation-induced leakage.

While the invention has been particularly shown and described with respect to illustrative and preferred embodiments thereof, it will be understood by those skilled in the art that the foregoing and other changes in form and details may be made therein without departing from the spirit and scope of the invention that should be limited only by the scope of the appended claims.

Having thus described our invention, what I claim as new, and desire to secure by Letters Patent is:

1. A method for forming a semiconductor field-effect transistor device comprising:
   a) forming a semiconductor structure comprising a material doped of a first dopant and having a non-zero number of threading dislocations, wherein the semiconductor structure comprises a multi-layer structure including a Si layer that is present over a SiGe layer;
   b) implanting a blocking impurity in said semiconductor structure, said blocking impurity is In or Sb, wherein said implanting the blocking impurity in said semiconductor structure includes implanting the blocking impurity with an energy such that a peak blocking impurity concentration approximately coincides with an interface between the Si layer and the SiGe layer;
   c) thermally processing said semiconductor structure such that said blocking impurities segregate to said non-zero number of threading dislocations, said blocking impurities further segregating to new dislocations that may be induced by said thermal processing;
   d) forming a dielectric layer on top of said semiconductor structure to define a gate region, and forming a gate electrode over said dielectric region, a portion of the semiconductor structure immediately beneath the gate defining a channel region, and a portion of the semiconductor structure beneath the channel region defining a well region; and
   e) implanting dopants in said semiconductor structure on opposite sides of said gate region to form source and drain regions wherein the source and drain regions abut the channel region and well region on either side, and wherein a dislocation or crystal defect extends continuously from said source to drain region, and an immediate vicinity of said crystal defect is substantially occupied by said blocking impurity dopant.

2. The method for forming a semiconductor field-effect transistor device as claimed in claim 1, wherein said implanting blocking impurity dopant materials in said semiconductor structure includes implanting a blocking impurity to provide a concentration of blocking impurity in the semiconductor structure ranging between about $10^{17}$ cm$^{-3}$-$10^{19}$ cm$^{-3}$.

3. The method for forming a semiconductor field-effect transistor device as claimed in claim 1 wherein said thermally processing comprises a thermal annealing step at an anneal temperature ranging between about 600° C.-1200° C.

* * * * *